United States Patent [19]
Belis et al.

[11] Patent Number: 5,563,919
[45] Date of Patent: Oct. 8, 1996

[54] HIGH-THROUGHPUT DIGITAL FILTERING METHOD AND APPARATUS FOR PERFORMING THE METHOD

[75] Inventors: Eric Belis; Daniel Rousset, both of Toulouse; André Marguinaud, Palaiseau; Jean-Didier Gayrard, Toulouse, all of France

[73] Assignee: Alcatel Espace, Courbevoie, France

[21] Appl. No.: 288,191

[22] Filed: Aug. 9, 1994

Related U.S. Application Data

[63] Continuation of Ser. No. 894,469, Jun. 5, 1992, abandoned.

[30] Foreign Application Priority Data

Jun. 7, 1991 [FR] France .................. 91 06936

[51] Int. Cl.⁶ .............. H04B 1/10; H03H 17/00
[52] U.S. Cl. .................... 375/350; 375/229
[58] Field of Search ............ 364/724.01, 724.16, 364/724.17, 724.19, 724.2; 375/229–236, 350, 346

[56] References Cited

PUBLICATIONS

Philips Journal of Research, vol. 30, No. 1, Feb. 1975, Einhoven, NL, pp. 73–84; T. A. Claasen E. A.: "Some Considerations on the Implementation of Digital Systems for Signal Processing".

IEEE Acoustics, Speech, and Signal Processing Magazine, vol. 25, No. 3, Jun. 1977, New York, US, pp. 256–257; Genya Kishi E. A.: "A New Realization Scheme of Digital Filters–Row–Wise Addition Configuration".

Technische Rundschau, vol. 81, No. 25, Jun. 23, 1989, Bern, Switzerland, pp. 52–55; Daniel Luthi: "Hochleistungs–D–S–Prozessoren in ASIC".

*Primary Examiner*—Stephen Chin
*Assistant Examiner*—Hai H. Phan
*Attorney, Agent, or Firm*—Sughrue, Mion, Zinn, Macpeak & Seas

[57] ABSTRACT

A high-throughput filtering method and corresponding apparatus in which each output sample sn is determined by weighting N input samples xi by multiplying the input samples by N coefficients, where the N coefficients are each decomposed into a set of coordinates, each coordinate corresponding to P bits of the coefficient. Essentially, input samples are multiplied by the coordinates of each of the coefficients in a pre-processing operation where the output signals corresponding to the resulting products for a coefficient are added in an adding block. A plurality of adding blocks are provided corresponding respectively to the coefficients such that each block includes the summation result of the products for a corresponding coefficient. The summation result from a previous adding block is added to the summation result of a current block, and the result of this addition is supplied to the next adding block. The output signal is obtained in this manner.

3 Claims, 3 Drawing Sheets

HIGH-THROUGHPUT DIGITAL FILTERING METHOD AND APPARATUS FOR PERFORMING THE METHOD

This is a continuation of application Ser. No. 07/894,469 filed Jun. 5, 1992, abandoned.

The present invention relates to a high-throughput digital filtering method and apparatus for performing the method.

BACKGROUND OF THE INVENTION

An aim of the invention is to make a digital filtering apparatus which is modular, which can be parameterized, and which is suited to installation in custom-designed circuits, e.g. of the ASIC (Application Specific Integrated Circuit) type, over an input bandwidth of several megahertz (e.g. 6 MHz) with a high-performance filtering characteristic. The apparatus must be programmable in passband, in transition band, in central frequency, and in type (i.e. low-pass, high-pass, band-pass, band-stop, or multi-band). Moreover, the apparatus must satisfy space requirements, in particular relating to: reliability, optimizing consumption, compactness, and insensitivity to radiation.

There are two possible approaches to making such apparatus:

It is possible to use a bank of filter elements, with the input band being decomposed by the bank into sub-band elements, and with only those sub-bands that belong to the band of the desired filter being recombined by the bank. The filter elements isolating the sub-bands are then fixed, and programmability is provided by selecting which sub-bands to recombine. The filter elements have filter characteristics and stability specifications which are quite tight: two types of installations are possible: one using surface acoustic wave (SAW) type filters; and the other using digital filters. But such "bank-of-filters" architecture is entirely satisfactory only for specific applications, since the band of the resulting filter can be programmed only at a pitch equal to the width of one sub-band. Moreover, great care must be taken in making the filter elements: their frequency stability and their filter characteristics must provide continuity in phase and in amplitude at the boundaries between the sub-bands so that the final recombination can be performed under the best possible conditions. Furthermore, frequency resolution is limited by the number of filter elements.

It is also possible to use a filter having a programmable filter characteristic. There are two main types of such programmable filters: switched-capacitance filters, and digital filters. Both types may be made with very large scale integration (VLSI) components available on the market. Switched-capacitance filters can process only signals having frequencies lower than a few tens of kilohertz. As regards variable-characteristic digital filters, the VLSI-type components on the market are at the edge of the desired frequency range. Furthermore, since they are general-purpose, they are over-dimensioned in most applications in particular as regards the size of the digital words processed, and this leads to an excessive consumption cost which is detrimental in a space application. Such VLSI digital filters integrate a large number of multiplier-adders which are themselves complex functions whose reliability is critical: since the architecture does not provide internal redundancy, reliability must be improved by adding on additional components, which is detrimental to the consumption of the filter. Moreover, each new type of component needs to be individually qualified for a space application.

Since no other known component is capable of solving the problem posed, an aim of the invention is to propose a solution to the problem, which solution enables the above-listed drawbacks to be mitigated.

SUMMARY OF THE INVENTION

The invention provides a high-throughput filtering method in which each output sample is obtained by weighting N input samples by means of N coefficients ki, wherein each coefficient is decomposed into a set of co-ordinates ki=[ai, bi, ci, di, . . . ], in which set each of the co-ordinates corresponds to p bits of the coefficient ki; wherein pre-processing common to all the coefficients is performed on each input sample xi; and wherein weighting-and-adding is performed on the signals output from pre-processing for each coefficient.

The invention also provides a filtering apparatus enabling the method to be performed, wherein said apparatus comprises firstly a common pre-processing block making it possible to calculate systematically the $2^p$ products of the input signal xi multiplied by integers ranging from 0 to $2^p-1$; and secondly N weighting-and-adding blocks in series. Each weighting-and-adding block sums a plurality of outputs from the pre-processing block (weighting); (the outputs are selected as a function of the value of the co-ordinates of the coefficient; each output is offset by p bits before being summed), and adds the resulting sum with the weighted sum of the preceding coefficients (adding).

In an advantageous embodiment, the apparatus comprises one or more identical circuits made using ASIC (Application Specific Integrated Circuit) technology.

Such apparatus offers numerous advantages, in particular:

operating speed: by using a pipe-line structure, it is possible to achieve an operating speed greater than the operating speed of components currently sold;

optimization of silicon size: the capacity of the architecture to be adapted to the needs of the user in an ASIC-type installation enables consumption and compactness to be optimized since the size of an ASIC-type circuit is reduced to the bare minimum for performing the desired function; moreover the same quantity of silicon is used with the same effectiveness to make different filtering bands while retaining the same values of filter ripple, attenuation, and roll-off steepness;

re-using the same design, and adaptability to requirements: installing the proposed architecture using ASIC technology enables the choice of technology to be adapted to the needs of the user: bipolar technology to increase the maximum filtering band; radiation-hardened (i.e. radiation-resistant) technology for space applications; CMOS technology for low consumption;

improvement in the frequency performance levels of the filter which can keep up with trends in technologies;

a modular structure using identical ASICs: the consequences of this are:

it is possible to improve reliability by adding additional filtering cells; since all the ASICs are reprogrammable and identical, it is possible to replace any one of them by offsetting the programming of the filtering system, and by using one of the redundancy circuits; and it is possible to reduce cost by only developing a single ASIC; and space qualification: using the filter in the space field implies qualifying an ASIC technology, and this opens up prospects for use other than merely qualifying a commercial component specific to digital filtering.

BRIEF DESCRIPTION OF THE DRAWINGS

An embodiment of the invention is described by way of example with reference to the accompanying drawings, in which.

DETAILED DESCRIPTION

Figure 1:
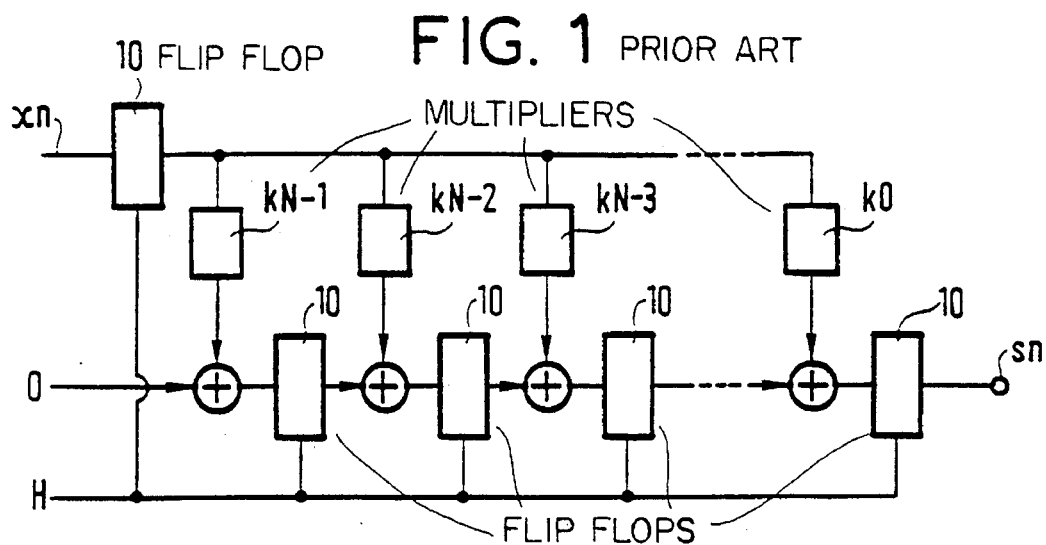
FIG. 1 shows known digital filter architecture.

The filtering apparatus of the invention is of the "FIR" (Finite Impulse Response) digital filter type, such as shown in FIG. 1, where each output sample (sn) is obtained by weighting the last N input samples (xi) with a set of N coefficients (ki) defining the filter, the filter using bistables (10) synchronized by a clock H.

This gives:

$$\sum_{i=0}^{i=N-1} k_i . x_{n-i}.$$

The installation structure adapted to the processing algorithm is referred to as the "transposed structure": the N input samples being stored after weighting.

In order to use an ASIC-type circuit, the filtering algorithm must therefore be installed using the facilities of the chip manufacturing library and minimizing the number of gates in the circuit. With this in mind, multiplication is eliminated from the processing and is decomposed into single elementary operations. Either not all manufacturers have a multiplication function, or else the size of the words is not adapted to requirements. Such decomposition further enables certain elementary operations common to different products to be re-used (reduction in the number of gates).

The principle of decomposing multiplication by a coefficient ki is such that each coefficient is decomposed into a set of co-ordinates: ki=(ai, bi, ci, di, . . . ), in which set each of the co-ordinates corresponds to p bits of the coefficient ki. In this way, 12/p co-ordinates correspond to the 12-bit encoded coefficients ki to make the filtering apparatus. For a number N of coefficients, there are therefore N×12/p co-ordinates which may take any of the values lying in the range 0 to $2^P-1$.

Figure 2:
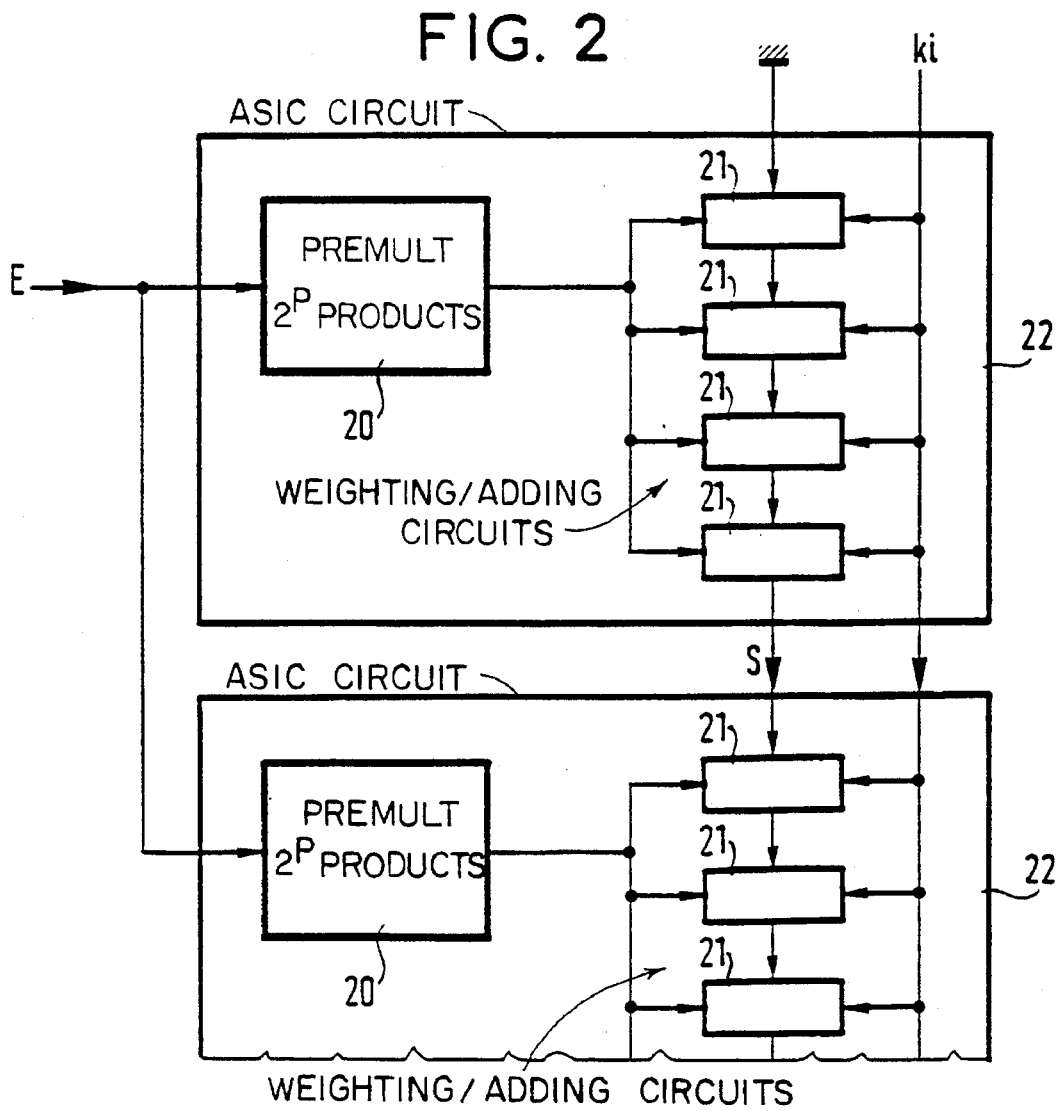
FIG. 2 shows the apparatus of the invention.

In the apparatus of the invention as shown in FIG. 2, pre-processing (20) is performed in each ASIC 22, and on each sample (xn). The pre-processing consists in systematically calculating the $2^P$ products of the input signal xn multiplied by integers ranging from 0 to $2^P-1$.

In practice, p is limited to being equal to 3 or 4. In this way, the products calculated are almost certainly used by one of the N×12/p co-ordinates ($2^P \ll 12.N/P$).

The $2^P$ elementary products are easily calculated for low values of p by offsets and additions relative to the binary representation of the input sample. The succession of calculations of the products is established by a "calculation tree" which optimizes re-use thereof (offsets-additions).

A pre-processing block 20 common to all the products is therefore followed by N weighting-and-adding blocks 21. Each of the blocks 21 merely sums the 12/p outputs of the pre-processing block 20, and then adds them with the result of the preceding block 21. The outputs are chosen as a function of the value of the co-ordinates of the coefficient in question; each output being offset by p bits relative to the preceding output before summing.

Programming the apparatus of the invention modifies the choice of outputs of the pre-processing block 20 by loading new co-ordinate values into the ASIC when a remote control signal is sent. The number of pre-processing block outputs used is a dimensioning parameter for the ASIC, and it increases with the number of coefficient bits.

Therefore, in the apparatus of the invention, a single pre-processing block 20 and as many weighting blocks 21 as possible are integrated into the ASIC. The larger the size of the ASIC, the more cost-effective the pre-processing, since the pre-processing is shared between a large number of coefficients. All the ASICs used in making the apparatus of the invention are identical.

An embodiment was made using CMOS-SOS technology which is well suited to space stresses as regards radiation. In a 7,000-gate circuit it was possible to integrate a preprocessing block and three weighting-and-adding blocks for 12-bit encoded coefficients and an 8-bit encoded input signal. The effectiveness of the algorithm was demonstrated because it enabled the equivalent of three VLSI circuits (performing the multiplication-adding) to be integrated in one component.

Figure 3:
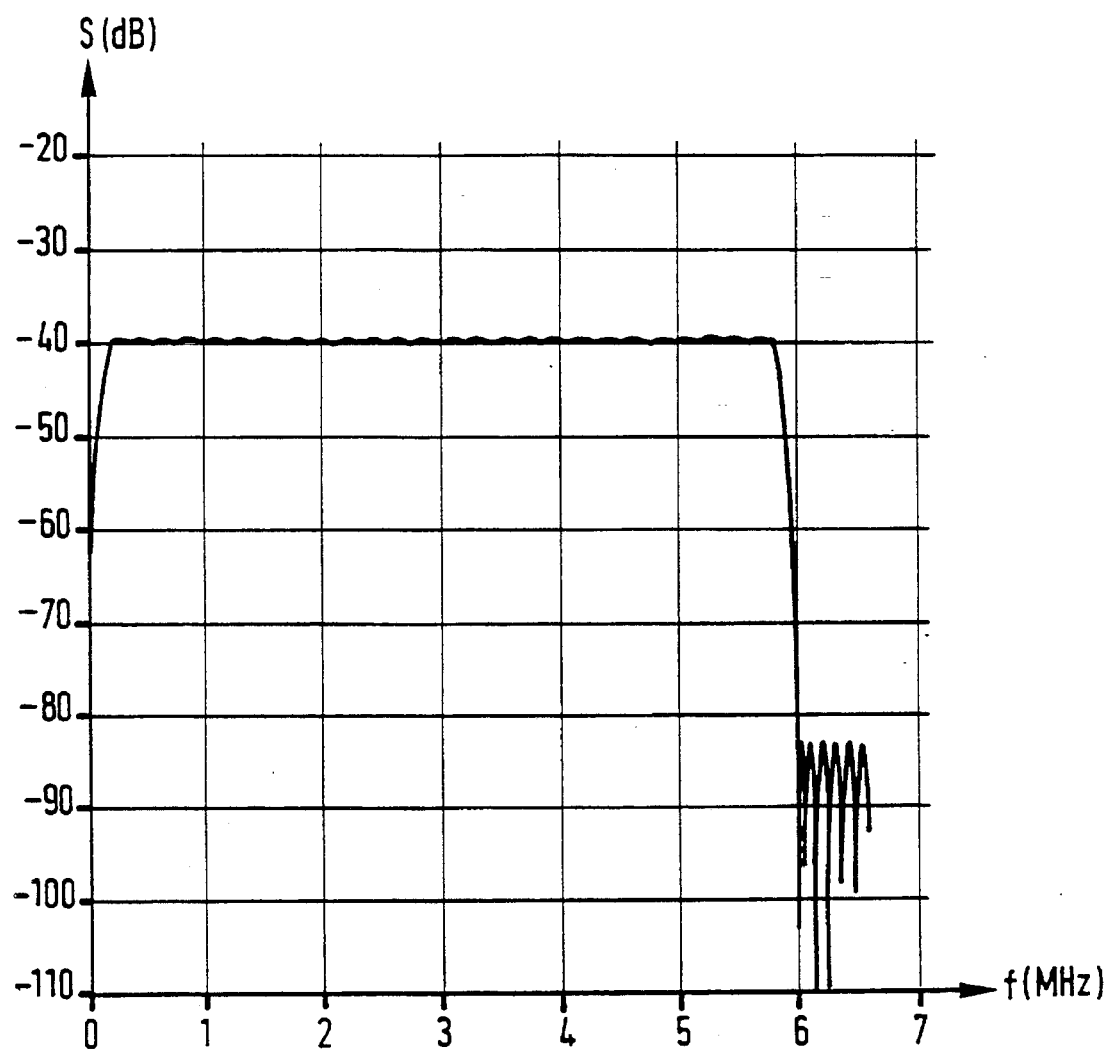
FIG. 3 shows a response curve of an embodiment of the apparatus of the invention.
Figure 4:
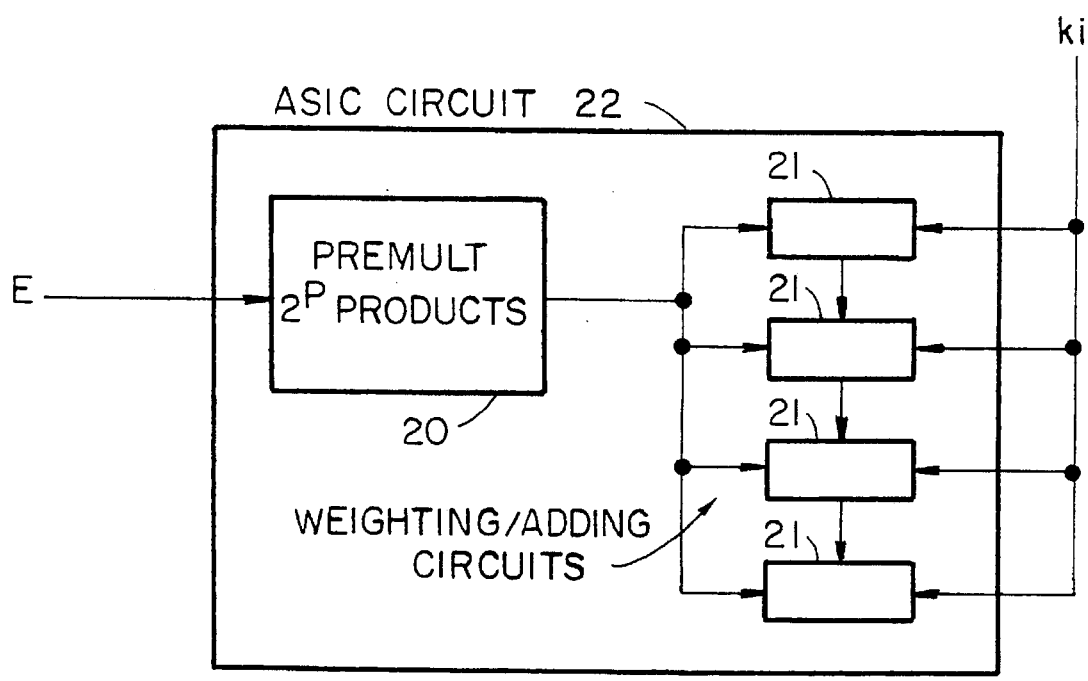
FIG. 4 shows a single ASIC circuit according to the present invention.

By using 40 identical ASICs it is possible, for example, to make all the filtering bands lying in the range 400 kHz and 5.6 MHz, with identical ripple (±0.35 dB), attenuation (40 dB), and roll-off steepness (200 kHz) characteristics. The curve shown in FIG. 3 corresponds to a frequency response for a band of 5.6 MHz and using 120 coefficients ki.

Naturally, the present invention is described and shown only by way of preferred example, and its constituent parts could be replaced by equivalent parts without going beyond the ambit of the invention.

Thus, since the maximum filtering band is limited by the choice of technology of the ASIC, it is possible to use the same electrical layout in bipolar technology, thereby enabling wider bands to be processed;

it is possible to integrate an output sub-sampling operation into each ASIC;

it is possible to increase the degree of integration of ASICs, thereby making the algorithm more effective since the cost of the pre-processing block may then be spread over a larger number of coefficients; the results of the above-mentioned embodiment demonstrate that it is possible to integrate 45 8-bit coefficients into a 60,000-gate ASIC; and by using reliable architecture, it is possible to isolate a faulty cell electronically and operationally in order to restore initial performance levels.

We claim:

1. A high-throughput filtering method for producing an output sample by weighting input samples of an input signal by means of N coefficients, said method comprising the steps of:

performing a pre-processing operation on said input samples by multiplying each of said input samples by $2^P$ integers having values ranging from 0 to $2^P-1$, where P is an integer value greater than 2, to produce $2^P$ product outputs, said pre-processing operation being common to all of said N coefficients;

supplying said N coefficients to a plurality of weighting and adding means, respectively, each of said N coefficients comprising a set of coordinates, each of said coordinates in said set of coordinates corresponding to P bits of a corresponding coefficient, where P corresponds to said integer value;

selecting, in each of said weighting and adding means, certain ones of said $2^P$ product outputs as selected $2^P$ products in accordance with a set of coordinates corresponding to one of said N coefficients supplied to an associated one of said weighting and adding means, processing, in each of said weighting and adding means, said selected $2^P$ products by offsetting each of said selected $2^P$ product outputs by P bits relative to a preceding product output, and adding said selected $2^P$ product outputs in each of said weighting and adding means to obtain a summation result; and adding a summation result supplied from a previous weighting and adding means to a current summation result obtained for a current weighting and adding means.

2. A filtering apparatus for implementing a filtering method for producing an output sample by weighting input samples of an input signal by means of N coefficients, wherein each of said N coefficients is composed of a set of coordinates, each of said coordinates in said set of coordinates corresponding to P bits of a corresponding coefficient, where P is an integer having a value greater than 2, said filtering apparatus comprising:

a single pre-processing means for calculating $2^P$ products by multiplying each of said input samples by $2^P$ integers having values ranging from 0 to $2^P-1$, where P corresponds to said integer value greater than 2; and N weighting and adding means, connected in series, each being supplied with a set of coordinates corresponding to one of said N coefficients and said $2^P$ products, wherein each of said N weighting and adding means selects certain ones of said $2^P$ products as selected $2^P$ products as a function of said set of coordinates corresponding to said one of said N coefficients supplied to an associated one of said weighting and adding means, and wherein said each of said weighting and adding means obtains a summation result of said selected $2^P$ products received from said single pre-processing means, and adds a summation result from a previous one of said weighting and adding means to a summation result from a current weighting and adding means to generate a filtered output signal.

3. The filtering apparatus according to claim 2, wherein said filtering apparatus is programmed by reloading a new set of coordinates for at least on of said N coefficients to said weighting and adding means via a remote control signal from an external device, wherein selection of said $2^P$ products is programmed according to values of said new set of coordinates.

* * * * *